United States Patent
Engelhardt et al.

(10) Patent No.: US 9,923,116 B2
(45) Date of Patent: Mar. 20, 2018

(54) METHOD FOR PRODUCING SOLAR CELLS HAVING SIMULTANEOUSLY ETCHED-BACK DOPED REGIONS

(71) Applicant: UNIVERSITÄT KONSTANZ, Constance (DE)

(72) Inventors: Josh Engelhardt, Constance (DE); Alexander Frey, Constance (DE); Yvonne Schiele, Constance (DE); Barbara Terheiden, Constance (DE)

(73) Assignee: UNIVERSITÄT KONSTANZ, Constance (DE)

( * ) Notice: Subject to any disclaimer, the term of this patent is extended or adjusted under 35 U.S.C. 154(b) by 0 days.

(21) Appl. No.: 15/124,909

(22) PCT Filed: Mar. 11, 2015

(86) PCT No.: PCT/EP2015/055042
§ 371 (c)(1),
(2) Date: Sep. 9, 2016

(87) PCT Pub. No.: WO2015/135974
PCT Pub. Date: Sep. 17, 2015

(65) Prior Publication Data
US 2017/0018676 A1    Jan. 19, 2017

(30) Foreign Application Priority Data
Mar. 12, 2014  (DE) .................. 10 2014 103 303

(51) Int. Cl.
H01L 31/00    (2006.01)
H01L 31/18    (2006.01)
(Continued)

(52) U.S. Cl.
CPC .. *H01L 31/1804* (2013.01); *H01L 31/022425* (2013.01); *H01L 31/0684* (2013.01); *Y02E 10/547* (2013.01); *Y02P 70/521* (2015.11)

(58) Field of Classification Search
CPC .................................................. H01L 31/1804
See application file for complete search history.

(56) References Cited

U.S. PATENT DOCUMENTS

| 2011/0186116 A1 | 8/2011 | Kruemberg et al. |
| 2012/0152338 A1 | 6/2012 | Ha et al. |

(Continued)

FOREIGN PATENT DOCUMENTS

| CN | 102148291 | 8/2011 |
| CN | 102664217 | 9/2012 |

(Continued)

OTHER PUBLICATIONS

Carlos Del Canizo et al., Analysis of a Technology for CZ Bifacial Solar Cells, IEEE Transactions on Electron Devices, IEEE Service Center, PI Sacataway, NJ, US, vol. 48, No. 10, Oct. 2001.

(Continued)

*Primary Examiner* — William Harriston
(74) *Attorney, Agent, or Firm* — Mannava & Kang, P.C.

(57) ABSTRACT

A method for producing a solar cell is described, in which a plurality of doped regions are to be etched-back selectively or over their entire surface. Once a semiconductor substrate (1) has been provided, various doped regions (3, 5) are formed in partial regions of a surface of the semiconductor substrate, the various doped regions (3, 5) differing as regards their doping concentration and/or their doping polarity. The various doped regions (3, 5) are then purposively etched-back in order to achieve desired doping profiles, and finally electrical contacts (21) are formed at least at some of the doped regions (3, 5). The etching-back of the various (Continued)

doped regions takes place in a common etching operation in an etching medium. In order that such common etching-back of various doped regions (3, 5) is possible, it is proposed purposively to adjust both properties of the initially unetched doped regions (3, 5) and parameters that influence the etching operation with regard to properties of the desired doping profiles within the etched doped regions.

13 Claims, 2 Drawing Sheets

(51) Int. Cl.
*H01L 31/0224* (2006.01)
*H01L 31/068* (2012.01)

(56) References Cited

U.S. PATENT DOCUMENTS

2012/0282722 A1* 11/2012 Wenham ......... H01L 31/022425
438/72
2013/0153025 A1 6/2013 Hahn

FOREIGN PATENT DOCUMENTS

| CN | 103608934 | | 2/2014 |
|---|---|---|---|
| DE | 102008048498 | A1 | 4/2010 |
| EP | 0499488 | A2 | 8/1992 |
| EP | 2323173 | A2 | 5/2011 |
| WO | WO-2009013307 | A2 | 1/2009 |
| WO | WO-2010/010462 | A1 | 1/2010 |
| WO | WO-2010/081858 | A2 | 7/2010 |
| WO | WO-2012028728 | A2 | 3/2012 |

OTHER PUBLICATIONS

Moehlecke A et al: "Practical High Efficiency Bifacial Solar Cells", World Conference on Photovoltaic Energy, Waikoloa, Dec. 5-9, 1994; New York, IEEE, US , vol. CONF 1, Dec. 5, 1994.
Coppye J et al: "High efficiency polycrystalline silicon solar cells with conventional and selective emitters", Proceedings of the Photovoltaic Specialists Conference. Las Vegas, Oct. 7-11, 1991.
International Search Report for PCT/EP2015/055042 dated Jun. 5, 2015.

* cited by examiner

METHOD FOR PRODUCING SOLAR CELLS HAVING SIMULTANEOUSLY ETCHED-BACK DOPED REGIONS

CLAIM FOR PRIORITY

The present application is a national stage filing under 35 U.S.C. § 371 of PCT application number PCT/EP2015/055042, having an international filing date of Mar. 11, 2015, which claims priority to German Patent Application Number. 10 2014 103303.5 having a filing date of Mar. 12, 2014, the disclosures of which are hereby incorporated by reference in their entireties.

FIELD OF THE INVENTION

The present invention relates to a method for producing solar cells having various etched-back doped regions.

TECHNOLOGICAL BACKGROUND

Solar cells are used as photovoltaic elements for converting light into electrical energy. To that end, various doped regions are provided in a semiconductor substrate such as, for example, a silicon wafer. The doped regions can differ on the one hand as regards their doping polarity, that is to say they can be n-type doped or p-type doped; on the other hand, the doped regions can also differ as regards the doping concentration, that is to say as regards the density of dopants within the volume of the doped region. On account of different types or densities of charge carriers within the various doped regions, a potential difference is produced at boundaries between adjacent doped regions. By means of such a potential difference, charge carrier pairs which have been generated in the vicinity of those boundaries by absorption of light can be spatially separated.

Many solar cell concepts have already been developed in which a plurality of different doped regions are formed adjacent to a surface of a semiconductor substrate, for example by the purposive diffusion of dopants. Doped regions formed in that manner generally have a doping concentration which is substantially higher than a base doping concentration originally prevailing in the semiconductor substrate. For example, the doped regions have a doping concentration of typically more than $1*10^{18}$ cm$^{-3}$.

For example, a simple conventional solar cell typically has on its front side which is to be oriented towards the sun an areal emitter region which has an opposite doping polarity to the base doping of the semiconductor substrate and a substantially higher doping concentration. On their back side, such solar cells generally have a doped region, referred to as BSF (back surface field), which has the same doping polarity as the base doping of the semiconductor substrate but possesses a substantially higher doping concentration.

In order to be able to feed the spatially separated charge carrier pairs generated in the semiconductor substrate under incident light to an external electric circuit, the semiconductor substrate is contacted via electrical contacts, base contacts contacting the BSF and emitter contacts contacting the emitter region in the example mentioned above. It has been found to be advantageous to design the emitter region to be thicker and/or to have a higher doping concentration in partial regions adjacent to the emitter contacts than in intermediate partial regions. This is referred to as a selective emitter, wherein the partial regions adjacent to the emitter contacts can be optimised in respect of an electrical contact resistance, whereas the intermediate partial regions can be optimised with regard to low recombination losses and accordingly as efficient a quantum yield as possible.

In an alternative solar cell concept, both types of contact are formed on the back side of the semiconductor substrate facing away from the sunlight. It is hereby possible, for example, for emitter doped regions and base doped regions to be formed alternately next to one another, for example in an interlaced arrangement, and to be contacted in each case by emitter and base contacts which are likewise arranged in an interlaced manner.

The various doped regions can be produced by means of different processing steps. For example, dopants can be formed by diffusion from a gas source that is to be considered inexhaustible, by diffusion from a solid dopant source applied temporarily, or by ion implantation. Different doping profiles are thereby obtained within the doped regions according to the type of processing, that is to say the doped regions can differ in particular as regards a surface doping concentration, as regards a profile depth, as regards a sheet resistance and, where appropriate, as regards a thickness of a cover layer such as, for example, a dopant-containing glass. The doping profiles resulting from the processing may frequently not be optimally configured for their intended use in the solar cell. It has therefore been found to be advantageous in many cases purposively to etch-back doped regions after their production. This is also referred to as "stain-etch" or "etch-back".

Inter alia because of their frequently very different etch-abilities by means of etching media, different doped regions on a semiconductor substrate have hitherto been etched-back in separate processing steps in solar cell production. Regions of the surface of the semiconductor substrate that are not to be etched are typically protected temporarily by etch masks, for example, and then the unprotected regions are etched-back by means of an etching operation which has specifically been optimised for the doped region that is to be etched-back and for the doping profile that is to be achieved.

In conventional solar cell production, this results in a considerable outlay in terms of work and material in order to etch-back the various doped regions.

DISCLOSURE OF THE INVENTION

There may be a need for a method for producing a solar cell by means of which various doped regions can be formed with a suitable doping profile and in which an outlay in terms of work, material and/or time is reduced as compared with conventional production methods.

Such a need can be met by a method according to the main claim of the present patent application. Advantageous embodiments are defined in the dependent claims.

According to a first aspect of the invention there is proposed a method for producing a solar cell which comprises providing a semiconductor substrate, forming various doped regions, etching-back the various doped regions in order to achieve desired doping profiles within the doped regions, and forming electrical contacts at least at some of the doped regions. The doped regions are thereby formed in partial regions of a surface of the semiconductor substrate, that is to say locally and spatially separated from one another, and differ at least as regards their doping concentration, that is to say their density or density distribution of dopants within a doped region, and/or their doping polarity, that is to say whether they contain n-type dopants or p-type dopants. The doped regions formed originally, whose initial doping profiles result from the doping process technologies that are used, can purposively be etched-back in order to optimise their doping profiles for specific purposes. Details will be given hereinbelow.

The proposed production method is characterised in that the etching-back of the various doped regions is carried out in a common etching operation in an etching medium. That is to say, the at least two different doped regions formed previously are etched-back simultaneously, that is to say at the same time in a single process step, in a common etching medium which etches all the doped regions. For such common etching-back, both properties of the initially unetched doped regions and parameters that influence the etching operation are purposively adjusted with regard to properties of the desired doping profiles after etching-back within the etched doped regions.

Ideas relating to the mentioned aspect and to embodiments of the invention can be regarded inter alia as being based on the ideas and findings described hereinbelow:

As explained in the introduction, in conventional methods for producing solar cells it has been assumed that, where a plurality of different doped regions are to be etched-back, an etch-back operation must be carried out separately for each doped region and optimised therefor. This assumption was based on the observation that, as regards their doping concentration and doping polarity, different doped regions are generally attacked very differently by the same etching medium. Accordingly, it was hitherto assumed that an etch-back operation which was optimised for a particular doped region would lead to unsuitable etching results in a different doped region.

Embodiments of the invention are based on the finding that, contrary to previous assumptions, it is entirely possible to etch-back different doped regions in a common etching operation. It was recognised, however, that it is generally not sufficient merely appropriately to choose parameters that influence the etching operation, but that it also appears to be necessary to take into consideration properties of the initially unetched doped regions, that is to say the doped regions as are obtained directly from their production processing.

In other words, it was recognised that, in the conventional production of solar cells, doped regions are generally produced by processing methods which result in properties of the initially unetched doped regions such that it appears impossible simultaneously to etch-back a plurality of different doped regions of that kind in a common etching operation; an attempt at optimising only the parameters that influence the etching operation generally remains without success.

It is therefore proposed herein, when optimising the etch-back operation, purposively to adapt or adjust not only the parameters that influence the etching operation but also the properties of the initially unetched doped regions. In other words, the processing methods used to form the various doped regions are purposively to be adapted in order to result in suitable properties of the initially unetched doped regions.

Properties of the initially unetched doped regions which can purposively be adjusted are inter alia a surface doping concentration, a sheet resistance, a doping profile depth and/or a cover layer thickness.

A surface doping concentration is understood as meaning a concentration of dopants at the surface of the semiconductor substrate in the region of the doped region in question.

The sheet resistance, which in some cases is also referred to as the (specific) surface resistance, can be understood as meaning an electric resistance of a layer forming the doped region in question when an electric current flows through it parallel to the layer surface. In general, therefore, the sheet resistance is higher, the thinner the layer and the lower the doping concentration within the layer.

A doping profile depth can be understood as meaning a distance from the surface of the semiconductor substrate at which a doping concentration, starting from that surface, has fallen to a value which corresponds substantially to the base doping concentration of the semiconductor substrate.

A cover layer thickness can be understood as meaning the thickness of a cover layer which is produced in the process before, during or after the formation of a doped region. For example, during the formation of a doped region by diffusion of dopants from a phosphorus- or boron-containing gas phase, a phosphosilicate glass (PSG) or a borosilicate glass (BSG) is produced at the surface of the doped region, the thickness of this cover layer generally depending on process parameters such as a temperature and composition of the gas phase used and on a duration of the diffusion operation. It is also possible to form a cover layer before or after the diffusion of the dopants by means of suitable methods. For example, a highly phosphorus-doped and defect-rich layer (also referred to as a so-called "dead layer") as well as an oxidised surface layer that is highly doped with boron can be regarded as such cover layers. Owing to the materials contained therein and/or its physical properties, the cover layer can have significantly different etching properties than the semiconductor substrate, or the doped regions thereof, that is actually to be etched during the etching operation by means of the etching medium. The purpose of such cover layers can accordingly be to delay an onset of the etching process in dependence on the significantly different etching speed of the cover layer as compared with the underlying doped region. The thickness of the cover layer can be adapted accordingly for that purpose.

Typically, the other mentioned properties of the initially unetched doped regions are also influenced by the process parameters, in particular of the diffusion process. For example, the surface doping concentration is higher, the higher the concentration of dopants in the dopant source that is used, that is to say, in the example of the cover layer obtained from the gas phase, within the diffusion gas. A doping profile depth and a cover layer thickness are typically greater, the higher a chosen temperature during a diffusion operation and/or the longer the duration of the diffusion operation. A resulting sheet resistance is accordingly typically lower, the higher the chosen diffusion temperature and/or diffusion time.

Parameters that influence the etching operation which can purposively be adjusted are inter alia an etching time, a composition of the etching medium and/or a temperature of the etching medium.

An etching time can be understood as meaning the period of time for which the doped region to be etched-back comes into contact with the etching medium.

A composition of the etching medium can be understood as meaning the etching, oxidising and/or other components that are contained in the etching medium and their relative proportions by volume or weight.

The temperature of the etching medium can be understood as meaning a temperature exhibited by the etching medium during contact with the doped region to be etched-back. The temperature can be, but does not necessarily have to be, constant throughout the entire etching operation. A temperature profile can optionally also purposively be adjusted.

In general, it can be assumed that an etching depth increases as the etching time increases, whereby the relationship is not necessarily linear. Furthermore, an etching rate generally also increases as the temperature of the etching medium increases, here too not necessarily linearly. Moreover, an etching rate generally increases, the higher the proportion of etching components and optionally also the proportion of oxidising components in the etching medium.

The finding that all or at least many of these properties of the initially unetched doped regions and parameters that influence the etching operation must purposively be adjusted or at least taken into consideration in order to be able suitably to configure an etching operation in a plurality of different doped regions in such a manner that a desired doping profile is produced in all those doped regions after etching-back was not obvious starting from the findings and assumptions hitherto underlying the production of solar cells.

The proposed method can be used for the production of very different solar cell concepts in which various doped regions are purposively formed on the surface of a semiconductor substrate. Each of the various doped regions can thereby be formed with a maximum doping concentration in the range of from $10^{18}$ cm$^{-3}$ to $10^{22}$ cm$^{-3}$. In other words, the doped regions can have a doping concentration which is considerably higher than a base doping concentration of the semiconductor substrate, which is typically in the range of from $10^{15}$ cm$^{-3}$ to $10^{17}$ cm$^{-3}$. The doped regions can accordingly act, as explained by way of example in the introduction, as an emitter, BSF or FSF (front surface field).

In addition, some or all of those doped regions, for example emitter regions, can be formed selectively, that is to say can have different partial regions with different properties within a doped region. To that end, in order to produce a selectively etched-back doped region, portions of a surface of the doped region that is selectively to be etched can be protected by an etch mask during the etching operation. The etch mask can locally prevent or at least lessen the attack of the etching medium during the etching operation, so that the doped region in the portions in question is not etched-back or is etched-back to a lesser degree than in adjacent unprotected portions and locally varying properties such as, for example, different doping profile depths, surface doping concentrations, etc. are produced. An etch mask can be formed in a manner known to the person skilled in the art, for example by local application of a lacquer layer or wax layer, for example with the aid of screen printing technologies.

In the case of the proposed production method, the doped regions can differ in particular as regards their doping polarity. In particular where doped regions of different polarity, that is to say n-type doped regions and p-type doped regions, are present on a semiconductor substrate, it was hitherto assumed that an etching operation cannot be suitably adapted to be optimised for both polarities because etching properties of an etching medium can typically differ very greatly according to whether a p-type region or an n-type region is to be etched. Only as a result of the finding that the properties of the initially unetched doped regions should also purposively be adapted with regard to the etching operation that is subsequently to be carried out does it appear possible to produce a solar cell by means of a single, common etch-back operation for both types of doped region.

The production method that is put forward can be used in particular for solar cells in which the semiconductor substrate is made of silicon. For example, the semiconductor substrate can be a silicon wafer or a silicon thin film. Most of the solar cells currently produced industrially are produced on the basis of monocrystalline, multicrystalline or polycrystalline silicon, and a large number of processing technologies are known for forming doped regions of different doping concentrations and polarities in such semiconductor substrates. It is further known that silicon can be etched by means of different etching media such as, for example, etching solutions based on HF (hydrofluoric acid), NaOH (sodium hydroxide solution) or KOH (potassium hydroxide solution).

According to one embodiment, the etching medium in the method that is put forward can be based on fluorine. It has been observed that fluorine is able to enter into a bond with silicon and accordingly is able to etch a silicon substrate.

Fluorine can be present in the etching medium in different ways. For example, the etching medium can be an HF solution. Alternatively, the etching medium can also be gaseous, for example, and comprise a fluorine constituent, such as, for example, SF$_6$ (sulfur hexafluoride).

The etching medium can further comprise an oxidising substance. The oxidising substance is able to oxidise silicon at the surface to a higher valency to form silicon oxide, which can then be attacked by a fluorine constituent in the etching medium.

Local oxidation of silicon to a higher valency as a result of the oxidising substance contained in the etching medium can lead to the local formation of a porous silicon layer, because the oxidation to a higher valency and subsequent etching off of the locally formed silicon oxide generally do not take place uniformly along the entire surface of the silicon substrate. It has been observed that an etching operation in which silicon is permanently oxidised to a higher valency and then etched off so that a porous layer is formed can be controlled particularly well as regards an etching rate and ultimately as regards an etching result.

The oxidising substance contained in the etching medium can in particular be one of the following: HNO$_3$ (nitric acid), H$_2$O$_2$ (hydrogen peroxide), X$_y$S$_2$O$_8$ (peroxide sulfates), X$_y$SO$_5$ (peroxymonosulfates), O$_3$ (ozone), X$_y$MnO$_4$ (permanganates), BrO$_3$ (bromate).

In a concrete example, the etching medium can be in the form of a solution of HF, HNO$_3$ (nitric acid) and H$_2$O (water). HNO$_3$ hereby acts as oxidising substance.

It has been observed that the presence of an oxidising constituent in the etching medium may be necessary for the etching of a silicon substrate in particular when an n-type doped region is to be etched-back. Accordingly, it can generally be assumed that the addition of an oxidising substance such as, for example, HNO$_3$, or the content thereof in the etching medium, should be chosen to be higher, the greater the extent to which an n-type doped region is to be etched. In this case, the nitrogen oxide density, with which the speed of etching especially can be adjusted, can be used as a further parameter that determines the etching process. It has further been observed that a p-type doped region, that is to say a doped region doped with boron, for example, can in principle be porously etched even without the addition of an oxidising substance to the etching medium because of the positive free charge carriers it contains.

In a concrete example, the etching solution can have an HF content of between 0 and 40 vol. % (percent by volume), an HNO$_3$ content of between 0 and 55 vol. % and an H$_2$O content of between 0 and 90 vol. %. This corresponds to a content of HF of between 0 and 23.2 mol/l and a content of HNO$_3$ of between 0 and 12.2 mol/l. The respective contents can purposively be adapted both to the original properties of the different doped regions formed previously and to the properties of those doped regions that are to be achieved after the etching operation.

In general, it can be assumed that a higher HF content leads to a higher etching rate and accordingly, based on an etching depth that is to be achieved, to a shorter etching time, independently of the doping polarity of the doped region that is to be etched. A higher $H_2O$ content has the opposite effect, that is to say lowers the etching rate. A higher $HNO_3$ content has the result, as mentioned, that n-type doped regions are etched better. In addition, it can be assumed that an etching rate is higher, the higher the doping concentration within the doped regions that are to be etched. However, most cover layers formed at the surface of the doped regions, that is to say, for example, a dopant-rich and/or defect-rich layer, generally cannot be etched with the same speed as the underlying doped region because of the high defect density that prevails in such layers.

In one embodiment of the method that is put forward, in which n-doped doped regions are also to be etched, the observation that the presence of an $HNO_3$ content in an etching solution forms an important aspect therefor can be used to the effect that the $HNO_3$ content in the etching solution is so chosen that significant etching no longer occurs below a certain doping concentration within that doped region. In other words, when planning an etching operation, the surface doping concentration which an n-type doped region is to have after the etching operation can be taken into consideration and the $HNO_3$ content within the etching solution can then be suitably adjusted so that significant etching no longer occurs below that surface doping concentration. It is thereby possible to achieve inter alia that, above a certain minimum etching time, an etching result in the region of the n-type doped region no longer depends on the total duration of the etching operation because the etching operation in that doped region is as it were saturated. The total etching time can accordingly be chosen arbitrarily above the minimum etching time in order, for example, to be able to influence an etching result in other doped regions, in particular in p-type doped regions, as desired.

According to the further embodiment of the production method that is put forward, at least one cover layer produced during the formation of one of the doped regions can purposively be produced in such a manner that, by means thereof, an onset of etching of the underlying doped region can purposively be delayed. In other words, the observation that, during the formation of doped regions, for example, by diffusion of dopants from a gas phase or from glasses, a cover layer in the form of, for example, a phosphosilicate glass or borosilicate glass is automatically formed at the same time, and the observation that this cover layer can be etched with a different speed than, for example, underlying or adjacent semiconductor layers, can purposively be used to delay an etching operation locally in specific doped regions. For example, in a doped region that is not to be etched or is to be etched only slightly, it can be ensured during the formation of that doped region that as thick and/or as dense a cover layer as possible is formed, which resists attack by an etching medium at least temporarily.

It is pointed out that possible features and advantages of the production process put forward herein for a solar cell are described with reference to various embodiments of the invention. A person skilled in the art will recognise that the features can be combined or interchanged in a suitable manner in order to arrive at further embodiments of the invention.

BRIEF DESCRIPTION OF THE DRAWINGS

Embodiments of the invention are described hereinbelow with reference to the accompanying drawings, whereby neither the description nor the drawings are to be interpreted as limiting the invention.

The figures are merely schematic and are not true to scale. Same reference numerals denote same features or features having the same effect in the various figures.

DETAILED DESCRIPTION OF EMBODIMENTS

Figures 1, 2:
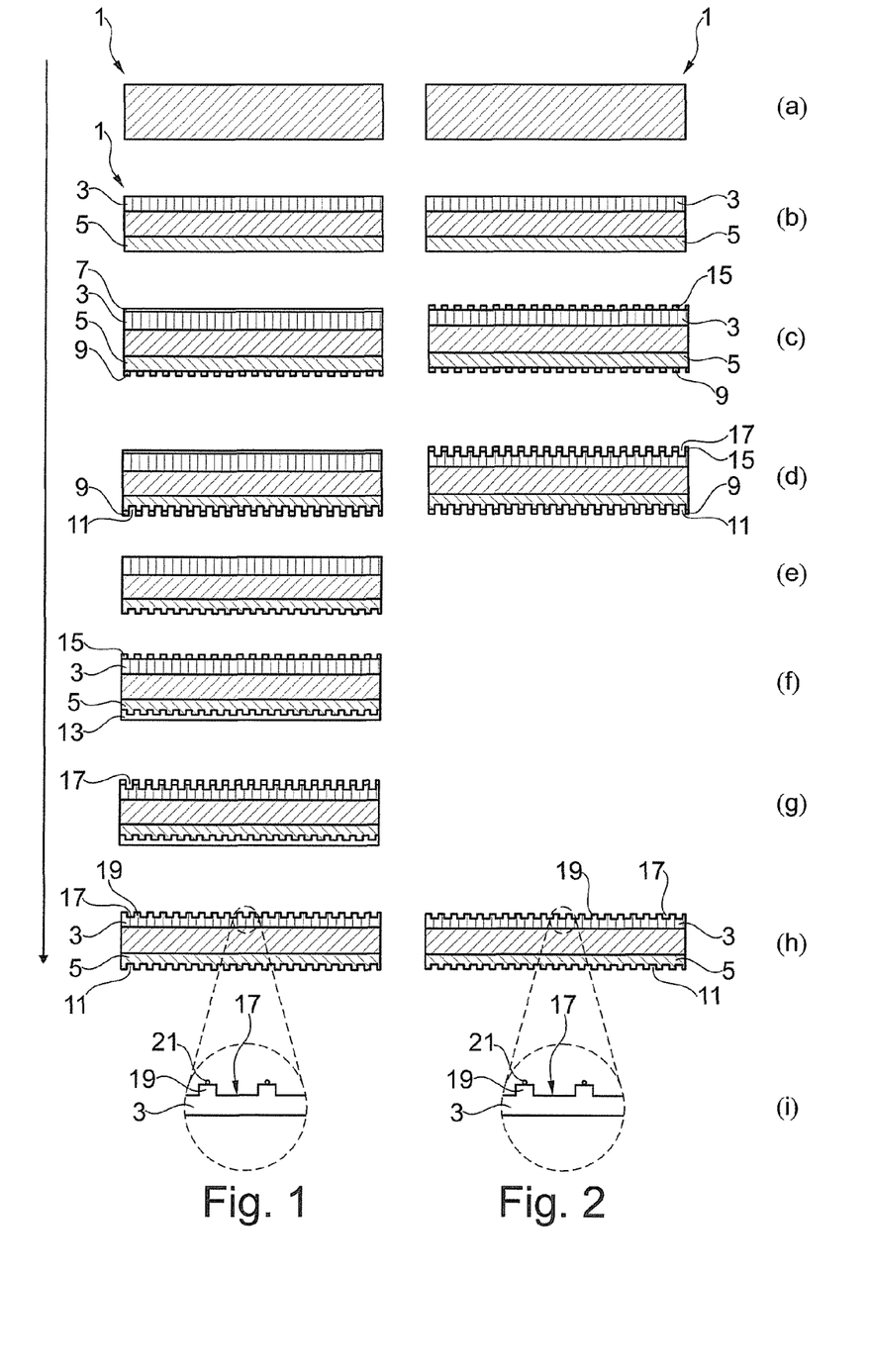
FIG. 1 illustrates a sequence of a conventional method for producing a solar cell.
FIG. 2 shows a sequence of a method for producing a solar cell according to an embodiment of the present invention.

FIGS. 1 and 2 show sequences of a method for producing a solar cell as have conventionally been used and as are proposed according to embodiments of the present invention, respectively.

In the case of the conventional production method shown in FIG. 1, a semiconductor substrate 1, for example in the form of a silicon wafer, is first provided (step (a)).

A plurality of different doped regions 3, 5 are then formed adjacent to a surface of the semiconductor substrate 1. For example, the semiconductor substrate 1 can have a base doping concentration, determined by boron dopants, in the range of from $10^{15}$ to $10^{17}$ cm$^{-3}$. In this p-type semiconductor substrate, an n-type emitter-like doped region 3 is produced on the front side by the diffusion of phosphorus. On the back side of the semiconductor substrate 1, a p-type BSF-like doped region 5 is produced by additional diffusion of boron (step (b)).

Both the emitter-like doped region 3 and the BSF-like doped region 5 are subsequently to be selectively etched-back.

To that end, the surface on the front side of the semiconductor substrate 1 and portions of the surface on the back side of the semiconductor substrate are first protected by means of an etch mask 7, 9 (step (c)).

The semiconductor substrate 1 is then exposed to an etching medium, and the partial regions 11 on the back side of the semiconductor substrate 1 that are not protected by the etch mask are accordingly etched-back (step (d)). The etching medium used and the other parameters influencing the etching operation were thereby optimised in respect of the properties of the BSF-like doped region 5 and the etching result to be achieved.

Once the etch mask 7, 9 applied previously has been removed (step (e)), the emitter-like doped region 3 on the front side is to be selectively etched-back. To that end, the whole of the surface of the back side is protected with an etch mask 13, and on the front side only portions of the surface of the semiconductor substrate 1 are covered with an etch mask 15 (step (f)).

The unprotected partial regions 17 of the emitter-like doped region 3 are then in turn selectively etched-back with the aid of an etching medium (step (g)), the etching medium and the other parameters influencing the etching operation purposively having been optimised for this purpose and generally differing significantly from the parameters used in the preceding etching operation.

Once this second etch mask 13, 15 has also been removed again (step (h)), electrical contacts 13 are formed both at the emitter-like doped region 3 and at the BSF-like doped region 5 in the unetched regions 19 which have remained during selective etching-back (step (i), enlarged and shown only for the front side). The electrical contacts 13 can be applied, for example, by printing or locally by vapour deposition.

In the embodiment of a method according to the invention for producing a solar cell that is shown in FIG. 2, the processing sequence can be shortened considerably.

While the provision of a semiconductor substrate (step (a)) and the formation of various doped regions 3, 5 (step (b)) can be carried out in a similar manner as in conventional production methods but generally using different processing parameters, subsequent selective etching-back both of the emitter-like doped region 3 and of the BSF-like doped region 5 can be carried out in a simplified, shorter processing subsequence.

To that end, etch masks 15, 9 are applied both to the front side and to the back side, which etch masks cover only portions of the surface of the doped regions 3, 5 to be etched (step (c)).

Then, in a common etching operation, the partial regions 11, 17 which are not protected by the respective etch mask 9, 15 are etched-back locally and selectively both in the emitter-like doped region 3 and in the BSF-like doped region 5 (step (d)).

However, not only are the parameters that influence the etching operation purposively adjusted with regard to properties of the desired doping profiles within the etched doped regions 11, 17 but, even during the formation of the various doped regions 3, 5 (in step (b)), it is ensured that those doped regions 3, 5 are adapted as regards their properties in such a manner that they can subsequently be etched in a common etching operation until desired etched-back doping profiles are achieved.

After removal of the etch masks 9, 15 (step (h)), electrical contacts 13 are again applied to the regions 19 of the emitter-like doped region 3 and of the BSF-like doped region 5 which have not been etched-back (step (i)).

It is pointed out that the above-described processing sequences for producing a solar cell can be modified and/or supplemented by further process steps. For example, cleaning steps, further etching steps and/or other processing steps can be carried out on the semiconductor substrate 1 before, during or after the described selective etching-back of doped regions 3, 5. In addition, further layers, such as, for example, dielectric layers, can be formed on the surfaces of the semiconductor substrate, which further layers can act as passivating layers, antireflection layers, protective layers and/or the like.

It is additionally pointed out that the proposed production method can be adapted for different solar cell concepts. The various doped regions can thereby be arranged on opposite surfaces of a semiconductor substrate or alternatively adjacent to one another on the same surface. In addition, the various doped regions can have opposite polarities or alternatively the same polarities but different doping concentrations.

By way of example, the proposed method can be used to produce bifacial solar cells having a back-side emitter and a front-side FSF-like doped region (front surface field). While six processing steps (steps (c) to (h) in FIG. 1) were hitherto necessary in the production of such bifacial solar cells simply to produce the etched-back structures, the processing sequence in the case of the production method proposed here by way of example can be shortened to only three processing steps.

Finally, properties of doped regions of solar cells which can be produced according to the invention and the etching operations which can be used thereby will be described with reference to FIGS. 3 and 4.

Figure 3:
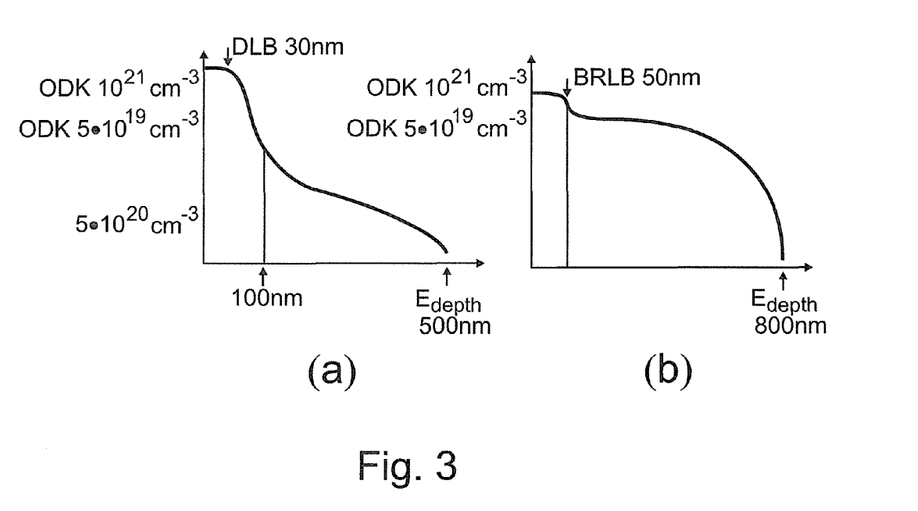
FIG. 3 shows doping profiles of two doped regions in the case of a solar cell to be produced according to the invention.

With reference to FIG. 3, a solar cell having a selective standard phosphorus emitter (n-type) on the front side (FIG. 3(a)) and a boron emitter (p-type) on the back side (FIG. 3(b)) is described.

The n-emitter is to be etched primarily, while the p-emitter is mainly to be freed of a highly doped boron-rich cover layer which acts as a dead layer. The front-side n-emitter is originally formed with a surface doping concentration ODK of $10^{21}$ cm$^{-3}$, a sheet resistance of 30 Ω/sq, a profile depth $E_{depth}$ of 500 nm and a dead layer width DLB of 30 nm. After etching-back, a surface doping concentration of $5*10^{19}$ cm$^{-3}$, a sheet resistance of 70 Ω/sq and a profile depth of 400 nm are to be achieved, and the dead layer is to have been removed completely.

The back-side p-emitter is initially formed with a surface doping concentration of $10^{20}$ cm$^{-3}$, a sheet resistance of 45 Ω/sq, a profile depth of 800 nm and a dead layer width of 50 nm. After etching-back, the surface doping concentration is to be $5*10^{19}$ cm$^{-3}$, the sheet resistance 50 Ω/sq, the profile depth 750 nm and the dead layer width 0 nm.

The etching solution used for the etching-back is rather HNO$_3$-heavy, that is to say a quotient of the amounts by volume of HF and HNO$_3$ is less than 1 (HF:HNO$_3$<1). In addition, the etching solution used is aqueous, that is to say a quotient of the amounts by volume of HNO$_3$ and H$_2$O is less than 1 (HNO$_3$:H$_2$O<1). The starting doping profiles are in this case also still dependent on n-emitter regions that are not to be etched, which regions are protected during the etching operation and therefore correspond to the starting profile.

Figure 4:
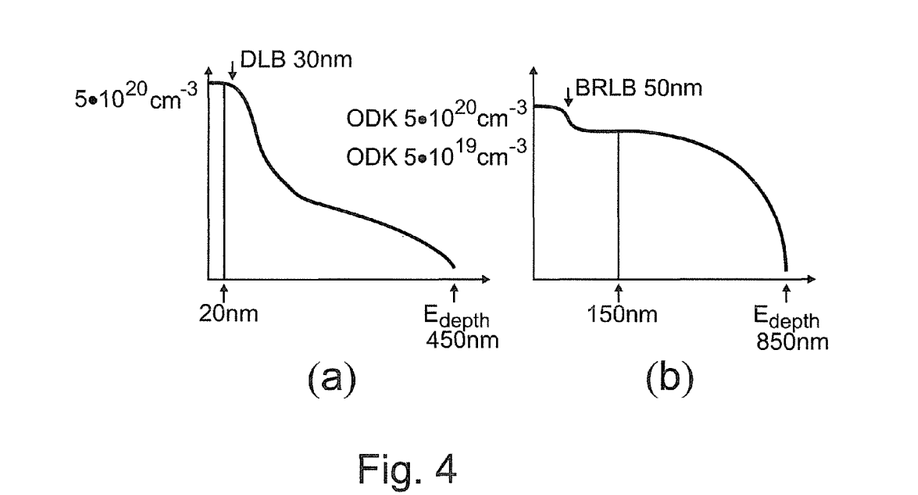
FIG. 4 shows doping profiles of two doped regions in the case of a further solar cell to be produced according to the invention.

With reference to FIG. 4, an alternative embodiment of the described production method and the properties of the doped regions used thereby and the parameters that influence the etching operation are explained. In the solar cell concept in question, a selective standard boron emitter (p-type) is to be formed on the front side (FIG. 4(b)). On the back side (FIG. 4(a)) of the substrate, a phosphorus emitter (n-type) is to be produced.

The p-emitter is formed with a surface doping concentration of $5*10^{20}$ cm$^{-3}$, a sheet resistance of 40 Ω/sq, a profile depth of 850 nm and a dead layer width of 50 nm. The p-emitter is to be etched primarily, and end values of a surface doping concentration of $5*10^{19}$ cm$^{-3}$, a sheet resistance of 80 Ω/sq, a profile depth of 700 nm and a dead layer width of 0 nm are to be achieved after etching.

The n-emitter on the back side is initially to be formed with a surface doping concentration of $5*10^{20}$ cm$^{-3}$, a sheet resistance of 50 Ω/sq, a profile depth of 450 nm and a dead layer width of 30 nm and is to be etched by only 20 nm during the etch-back operation in order to remove the portion of the n-emitter close to the surface which has the greatest recombinative effect. After etching-back, end values of a surface doping concentration of $3*10^{20}$ cm$^{-3}$, a sheet resistance of 55 Ω/sq, a profile depth of 430 nm and a dead layer width of 10 nm are to be achieved.

The etching solution used in the case of such properties of the two doped regions can be relatively balanced, that is to say an amount by volume of HF and of HNO$_3$ can be approximately equal (HF:HNO$_3$=approximately 1). The etching solution should also be aqueous, that is to say an amount by volume of $HNO_3$ should be small in relation to an amount by volume of water ($HNO_3:H_2O<1$). In this case too, the starting profiles are still dependent on p-emitter regions which are not to be etched, which regions are protected during the etching operation and therefore correspond to the starting profile.

As a third example, a combination of the two examples described with reference to FIGS. 3 and 4 is conceivable, in which a plurality of n-type and p-type emitter regions are provided on a semiconductor substrate. In such an example, it can be advantageous to choose the $HNO_3$ content of the etching solution to be higher and in some circumstances additionally to provide a cover layer of borosilicate glass in some of the doped regions in order, for example, to delay etching of the p-emitter which is to be etched relatively more quickly.

Furthermore, the individual differently doped regions which have been formed in part by simultaneous etching can be produced on both sides of the substrate in locally limited regions. As a result, it is possible, in dependence on the substrate doping, to implement front-side and/or back-side contacted solar cell concepts, that is to say solar cell concepts provided on the front side or on the back side with p-n junctions. Examples are "front-junction" (standard solar cell), "back-junction" and IBC (interdigitated back junction) solar cells.

Finally, it is pointed out that the terms "comprise", "have" etc. are not intended to exclude the presence of further additional elements. The term "a" also does not exclude the presence of a plurality of elements or objects. Furthermore, further method steps may be necessary or advantageous in addition to the method steps mentioned in the claims, in order, for example, finally to complete a solar cell. The reference numerals in the claims serve merely for better readability and are not intended to limit the scope of protection of the claims in any way.

LIST OF REFERENCE NUMERALS

1 semiconductor substrate
3 front-side emitter-like doped region
5 back-side BSF-like doped region
7 front-side etch mask
9 selective back-side etch mask
11 selectively etched-back partial regions
13 back-side etch mask
15 selective front-side etch mask
17 selectively etched-back partial regions
19 unetched partial regions
21 electrical contacts

The invention claimed is:

1. A method for producing a solar cell, comprising:
providing a semiconductor substrate;
forming various doped regions in partial regions of at least one surface of the semiconductor substrate, wherein the various doped regions differ as regards their doping concentration and/or their doping polarity;
etching-back the various doped regions in order to achieve desired doping profiles within the doped regions;
forming electrical contacts at least at some of the doped regions;
characterised in that
the etching-back of the various doped regions is carried out in a common etching operation under influence of an etching medium,
wherein both properties of the initially unetched doped regions and parameters that influence the etching operation are purposively adjusted with regard to properties of the desired doping profiles within the etched doped regions, and
wherein at least one cover layer which is produced before, during or after the formation of a doped region is purposively produced in such a manner that, with the aid thereof, an onset of etching of the underlying doped region is purposively delayed.

2. Method according to claim 1, wherein properties of the initially unetched doped regions which are purposively adjusted are a surface doping concentration, a sheet resistance, a doping profile depth and/or a cover layer thickness, and wherein parameters that influence the etching operation which are purposively adjusted are an etching time, a composition of the etching medium and/or a temperature of the etching medium.

3. Method according to claim 1, wherein each of the various doped regions is formed with a maximum doping concentration in the range of from $10^{18}$ cm$^{-3}$ to $10^{22}$ cm$^{-3}$.

4. Method according to claim 1, wherein the etching medium is based on fluorine.

5. Method according to claim 1, wherein the etching medium is an HF solution.

6. Method according to claim 1, wherein the etching medium comprises an oxidising substance.

7. Method according to claim 6, wherein the etching medium comprises at least one oxidising substance selected from the group comprising $HNO_3$, $H_2O_2$, $X_yS_2O_8$, $X_ySO_5$, $O_3$, $X_yMnO_4$ and $BrO_3$.

8. Method according to claim 1, wherein the etching medium is a solution of HF, $HNO_3$ and $H_2O$.

9. Method according to claim 8, wherein the solution has an HF content of from 0 to 40 vol. %, an $HNO_3$ content of from 0 to 55 vol. % and an $H_2O$ content of from 0 to 90 vol. %.

10. Method according to claim 1, wherein at least one of the doped regions is n-doped and wherein an $HNO_3$ content in the etching solution is so chosen that significant etching no longer occurs below a specific doping concentration within that doping range.

11. A method for producing a solar cell, comprising:
providing a semiconductor substrate;
forming various doped regions in partial regions of at least one surface of the semiconductor substrate, wherein the various doped regions differ as regards their doping concentration and/or their doping polarity;
etching-back the various doped regions in order to achieve desired doping profiles within the doped regions;
forming electrical contacts at least at some of the doped regions;
characterised in that
the etching-back of the various doped regions is carried out in a common etching operation under influence of an etching medium,
wherein both properties of the initially unetched doped regions and parameters that influence the etching operation are purposively adjusted with regard to properties of the desired doping profiles within the etched doped regions, and
wherein the various doped regions have different polarities.

12. A method for producing a solar cell, comprising:
providing a semiconductor substrate;

forming various doped regions in partial regions of at least one surface of the semiconductor substrate, wherein the various doped regions differ as regards their doping concentration and/or their doping polarity;

etching-back the various doped regions in order to achieve desired doping profiles within the doped regions;

forming electrical contacts at least at some of the doped regions;

characterised in that the etching-back of the various doped regions is carried out in a common etching operation under influence of an etching medium, wherein both properties of the initially unetched doped regions and parameters that influence the etching operation are purposively adjusted with regard to properties of the desired doping profiles within the etched doped regions, and wherein, for the production of a selectively etched doped region, portions of a surface of the doped region that is selectively to be etched are protected with an etch mask.

13. Method according to claim 1, wherein the semiconductor substrate consists of silicon.

* * * * *